United States Patent
Horita

(10) Patent No.: US 10,491,250 B2
(45) Date of Patent: Nov. 26, 2019

(54) HIGH-FREQUENCY FRONT END CIRCUIT AND SPURIOUS-WAVE SUPPRESSING METHOD

(71) Applicant: Murata Manufacturing Co., Ltd., Kyoto (JP)

(72) Inventor: Atsushi Horita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/956,262

(22) Filed: Apr. 18, 2018

(65) Prior Publication Data

US 2018/0241367 A1 Aug. 23, 2018

Related U.S. Application Data

(63) Continuation of application No. PCT/JP2016/074575, filed on Aug. 24, 2016.

(30) Foreign Application Priority Data

Oct. 19, 2015 (JP) ................................ 2015-205247

(51) Int. Cl.
*H04B 1/10* (2006.01)
*H03H 7/075* (2006.01)
(Continued)

(52) U.S. Cl.
CPC ............. *H04B 1/10* (2013.01); *H03H 7/075* (2013.01); *H03H 7/12* (2013.01); *H03H 7/38* (2013.01);
(Continued)

(58) Field of Classification Search
CPC ........ H03H 7/075; H03H 7/0115; H03H 7/12; H03H 7/38; H04B 1/10; H04B 1/40; H04W 72/08
(Continued)

(56) References Cited

U.S. PATENT DOCUMENTS

2012/0063373 A1\* 3/2012 Chincholi ............... H04L 5/001
370/281
2012/0307947 A1 12/2012 Kodama
2013/0156074 A1 6/2013 Wang et al.

FOREIGN PATENT DOCUMENTS

CN 103166654 A 6/2013
JP 2007-288529 A 11/2007
(Continued)

OTHER PUBLICATIONS

Elliot et al., "Efficient TV White Space Filter Bank Transceiver", 20th European Singla Processing Conference (EUSIPCO 2012), Bucharest, Romania, Aug. 27-31, 2012, pp. 1079-1083.\*
(Continued)

*Primary Examiner* — Benny T Lee
*Assistant Examiner* — Hafizur Rahman
(74) *Attorney, Agent, or Firm* — Pearne & Gordon LLP

(57) ABSTRACT

A high-frequency front end circuit includes a fixed frequency filter and an interference-wave suppression variable filter. The fixed frequency filter attenuates a high-frequency signal outside a specific frequency band. The interference-wave suppression variable filter attenuates a high-frequency signal in at least one used communication channel, among used communication channels that are used by a system and that causes an interference wave occurring in a neighbor frequency domain including a wireless communication channel.

10 Claims, 6 Drawing Sheets

(51) Int. Cl.
  H03H 7/12 (2006.01)
  H04B 1/40 (2015.01)
  H04W 72/08 (2009.01)
  H03H 7/38 (2006.01)
  *H03H 7/01* (2006.01)
  *H03H 9/54* (2006.01)
  *H03H 9/60* (2006.01)
  *H03H 9/64* (2006.01)

(52) U.S. Cl.
  CPC ............ H04B 1/1027 (2013.01); H04B 1/40 (2013.01); H04W 72/08 (2013.01); *H03H 7/0115* (2013.01); *H03H 7/1708* (2013.01); *H03H 7/1758* (2013.01); *H03H 7/1775* (2013.01); *H03H 9/542* (2013.01); *H03H 9/605* (2013.01); *H03H 9/6403* (2013.01); *H03H 9/6483* (2013.01); *H03H 2210/012* (2013.01); *H03H 2210/025* (2013.01)

(58) Field of Classification Search
  USPC ....................................................... 333/17.1
  See application file for complete search history.

(56) References Cited

FOREIGN PATENT DOCUMENTS

| JP | 2010-183255 A | 8/2010 |
|---|---|---|
| JP | 2013-090165 A | 5/2013 |
| JP | 2013-247605 A | 12/2013 |
| JP | 5591954 B2 | 9/2014 |
| WO | 2011/104804 A1 | 9/2011 |

OTHER PUBLICATIONS

Zurutuza, "Cognitive Radio and TV White Space Communications TV White Space Geo-location Database System", MSc. Thesis, NTTU, Jun. 2011, pp. 17-18.*

Golikov et al., "Passive intermodulation distortion measurements in mobile communication antennas", IEEE 54th Vehicular Technology Conference, Oct. 2001. Proceedings, pp. 2623-2625. (Year: 2001).*

Lui, "Passive intermodulation interference in communication systems", Electronics ans Communications Engineering Journal, Jun. 1990, pp. 109-118 (Year: 1990).*

Meaning of "Spurious Singal", Collins English Dictionary, 5th Edition first published in 2000, HarperCollins Publisher. (Year: 2000).*

International Search Report for International Application No. PCT/JP2016/074575 dated Oct. 11, 2016.

Written Opinion for International Application No. PCT/JP2016/074575 dated Oct. 11, 2016.

* cited by examiner

HIGH-FREQUENCY FRONT END CIRCUIT AND SPURIOUS-WAVE SUPPRESSING METHOD

This is a continuation of International Application No. PCT/JP2016/074575 filed on Aug. 24, 2016 which claims priority from Japanese Patent Application No. 2015-205247 filed on Oct. 19, 2015. The contents of these applications are incorporated herein by reference in their entireties.

BACKGROUND

Technical Field

The present disclosure relates to a high-frequency front end circuit that performs wireless communication and a spurious-wave suppressing method in the wireless communication.

Various technologies for effective use of frequency bands used in wireless communication are currently proposed. For example, Patent Document 1 describes a system that performs the wireless communication using television (TV) white spaces.

The wireless communication using the TV white spaces is a technology in which the frequency band used for television broadcasting in the past is opened and the frequency band is used in the wireless communication. In the wireless communication using the TV white spaces, free channels (free communication channels) that are not used for the television broadcasting are used in the wireless communication. Wireless communication devices perform the wireless communication using the free communication channels in the communication band of the television broadcasting, which is allocated in a database.

Patent Document 1: Japanese Unexamined Patent Application Publication No. 2013-90165

BRIEF SUMMARY

However, since the channels used for the television broadcasting are varied depending on the coverage or the like in, for example, television broadcasting systems that are currently in widespread use, the frequency of spurious wave for the wireless communication is not necessarily constant in the wireless communication using the TV white spaces.

Accordingly, when the spurious waves are suppressed using fixed filters, as in general wireless communication systems in related art, the spurious waves may not be addressed when the frequencies causing the spurious waves (the frequencies of used communication channels used by, for example, the television broadcasting systems) are varied.

The spurious waves include not only a television broadcasting signal in the channel of the spurious waves which adversely affects the wireless communication but also a signal caused by interference between the television broadcasting signals of multiple channels.

Accordingly, the present disclosure provides a high-frequency front end circuit capable of suppressing the spurious waves even when the frequencies of the communication channels used by a system are varied and a spurious-wave suppressing method.

The present disclosure provides a high-frequency front end circuit that, in a communication band composed of multiple communication channels within a specific frequency band used by a system, determines a wireless communication channel from free communication channels that are not used by the system, among the multiple communication channels, to perform wireless communication using the wireless communication channel. The high-frequency front end circuit includes a filter and a variable filter. The filter attenuates a high-frequency signal outside the specific frequency band. The variable filter attenuates a high-frequency signal in at least one used communication channel, among used communication channels that are used by the system and that causes an interference wave occurring in a neighbor frequency domain including the wireless communication channel.

With the above configuration, the high-frequency signal in the used communication channel causing the interference wave is attenuated to suppress the interference wave. Accordingly, the receiving sensitivity in the wireless communication channel is not degraded even if the frequency of the interference wave is close to the frequency of the wireless communication channel.

The high-frequency front end circuit of the present disclosure can have the following configuration. The system is a wireless communication system using TV white spaces. The specific frequency band is a frequency band used for television broadcasting. The communication channels are channels used for the television broadcasting.

With the above configuration, the interference waves in the multiple channels used for the television broadcasting are suppressed to suppress the degradation of the receiving sensitivity in the wireless communication channel in the specific frequency band used for the television broadcasting.

In the high-frequency front end circuit of the present disclosure, the used communication channel causing the interference wave can be the communication channel used for the television broadcasting.

With the above configuration, the degradation of the receiving sensitivity in the wireless communication channel is suppressed in the wireless communication system using the TV white spaces.

In the high-frequency front end circuit of the present disclosure, a width of the frequency band of the communication channels can be 20 MHz or lower and that the neighbor frequency domain can be a frequency domain up to the communication channel apart from the wireless communication channel by three communication channels.

With the above configuration, the degradation of the receiving sensitivity in the wireless communication channel, which is caused by the interference wave, is suppressed even when the frequency band width of the communication channels is narrow and the frequency interval between adjacent communication channels is narrow.

The high-frequency front end circuit of the present disclosure can have the following configuration. The high-frequency front end circuit further includes an elastic wave variable filter that attenuates a spurious wave occurring in the neighbor frequency domain and that includes an elastic wave element and a variable capacitor. The variable filter is an LC variable filter including an inductor and a capacitor. The variable filter attenuates the high-frequency signal in the used communication channel causing the interference wave that is not attenuated by the elastic wave variable filter.

With the above configuration, the spurious wave near the wireless communication channel is attenuated by the elastic wave variable filter. In addition, if the spurious wave, which is the interference wave occurring in the used communication channel apart from the wireless communication channel, is not capable of being attenuated by the elastic wave variable filter, the interference wave is suppressed by the variable filter. Accordingly, the degradation of the receiving sensitivity in the wireless communication channel is further suppressed.

The high-frequency front end circuit of the present disclosure can have the following configuration. The high-frequency front end circuit further includes an RFIC. The RFIC acquires information concerning the communication channels used by the system and detects whether the interference wave occurs in the neighbor frequency domain. The RFIC identifies the used communication channel causing the interference wave if the interference wave occurs in the neighbor frequency domain. The RFIC specifies a frequency to be attenuated in association with the identified used communication channel for the variable filter. The variable filter attenuates the frequency specified by the RFIC.

With the above configuration, the used communication channel causing the interference wave is acquired from the information to further suppress the interference wave.

The high-frequency front end circuit of the present disclosure can have the following configuration. The RFIC detects a receiving sensitivity in the wireless communication channel. The RFIC specifies a frequency to be attenuated for the variable filter if the receiving sensitivity is lower than or equal to a threshold value necessary to establish the wireless communication.

With the above configuration, the effect of suppressing the interference wave is realized in accordance with the receiving sensitivity as needed. Accordingly, the filter characteristics of the variable filter are suppressed from being unnecessarily changed.

The high-frequency front end circuit of the present disclosure can have the following configuration. The variable filter includes an input terminal, an output terminal, a series arm LC filter circuit, and first and second parallel arm LC filter circuits. The series arm LC filter circuit is connected between the input terminal and the output terminal. Both ends of the first parallel arm LC filter circuit are one end of the series arm LC filter circuit and ground potential. Both ends of the second parallel arm LC filter circuit are the other end of the series arm LC filter circuit and the ground potential. The first parallel arm LC filter circuit and the second parallel arm LC filter circuit, each includes a variable capacitor and an inductor, which are connected in series to each other. The series arm LC filter circuit includes a fixed capacitor, an LC series circuit, and an LC parallel circuit. The fixed capacitor is connected in parallel to the LC series circuit. Both ends of the LC series circuit are the input terminal and the output terminal and the LC series circuit includes a fixed capacitor and an inductor, which are connected in series to each other. The LC parallel circuit includes a variable capacitor and an inductor, which are connected in parallel to each other. The inductor included in the LC series circuit is directly connected to the output terminal or is connected to the output terminal with another inductor interposed therebetween.

With the above configuration, the filter characteristics of an interference-wave suppression variable filter are improved.

In the high-frequency front end circuit of the present disclosure, the wireless communication channel used by the system may be used for wireless communication using a frequency division duplex (FDD) system in which the frequency of a transmission signal is different from the frequency of a reception signal.

The case is described in which the FDD is used for the wireless communication channel. For example, the wireless communication using the FDD is realized also in a time division duplex (TDD) system, such as the television broadcasting.

The present disclosure provides a spurious-wave suppressing method including the following steps. The spurious-wave suppressing method includes a step of acquiring multiple communication channels within a specific frequency band used by a system. The spurious-wave suppressing method includes a step of determining a wireless communication channel from free communication channels that are not used by the system, among the multiple communication channels. The spurious-wave suppressing method includes a step of determining whether an interference wave corresponding to a used communication channel used by the system occurs in a neighbor frequency domain including the wireless communication channel. The spurious-wave suppressing method includes a step of adjusting attenuation characteristics of a variable filter so that a high-frequency signal in at least one used communication channel, among the used communication channels causing the interference wave, is attenuated if it is determined that the interference wave occurs in the neighbor frequency domain including the wireless communication channel.

With the above method, the interference wave is suppressed even when the spurious wave is the interference wave in the multiple used communication channel apart from the wireless communication channel.

According to the present disclosure, it is possible to suppress the spurious wave even when the frequencies of the communication channels used by the system are varied.

DETAILED DESCRIPTION

Figure 1:
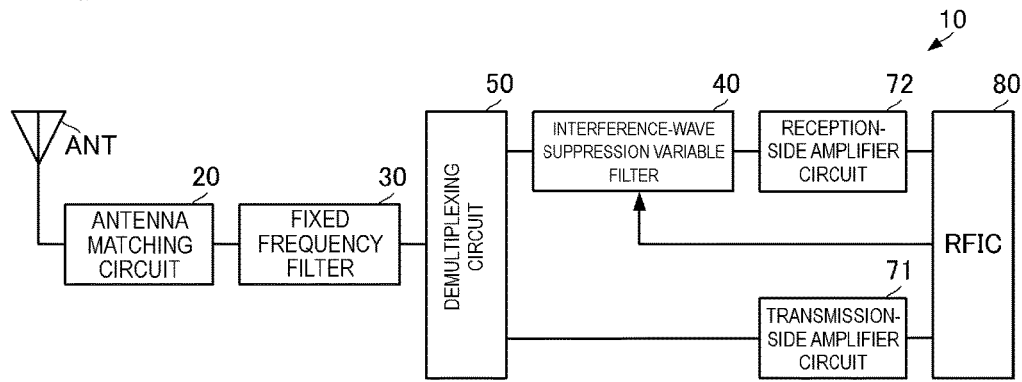
FIG. 1 is a functional block diagram of a high-frequency front end circuit according to a first embodiment of the present disclosure.

A high-frequency front end circuit according to a first embodiment of the present disclosure will herein be described with reference to the drawings. FIG. 1 is a functional block diagram of the high-frequency front end circuit according to the first embodiment of the present disclosure.

A high-frequency front end circuit 10 includes an antenna ANT, an antenna matching circuit 20, a fixed frequency filter 30, an interference-wave suppression variable filter 40, a demultiplexing circuit 50, a transmission-side amplifier circuit 71, a reception-side amplifier circuit 72, and a radio frequency integrated circuit (RFIC) 80. It is sufficient for the high-frequency front end circuit 10 to at least include the fixed frequency filter 30, the interference-wave suppression variable filter 40, and the demultiplexing circuit 50. The fixed frequency filter 30 corresponds to a "filter" of the present disclosure. The interference-wave suppression variable filter 40 corresponds to a "variable filter" of the present disclosure.

The antenna ANT is connected to the antenna matching circuit 20. The antenna matching circuit 20 is connected to the fixed frequency filter 30. The antenna matching circuit 20 may be a fixed matching circuit or a variable matching circuit. The fixed frequency filter 30 is connected to an antenna-side terminal of the demultiplexing circuit 50. A transmission-side terminal of the demultiplexing circuit 50 is connected to the transmission-side amplifier circuit 71. A reception-side terminal of the demultiplexing circuit 50 is connected to the interference-wave suppression variable filter 40. The interference-wave suppression variable filter 40 is connected to the reception-side amplifier circuit 72. The transmission-side amplifier circuit 71 and the reception-side amplifier circuit 72 are connected to the RFIC 80. The transmission-side amplifier circuit 71 is a so-called power amplifier (PA) and amplifies a transmission signal supplied from the RFIC 80 to supply the amplified transmission signal to the demultiplexing circuit 50. The reception-side amplifier circuit 72 is a so-called low noise amplifier (LNA) and amplifies a reception signal supplied from the interference-wave suppression variable filter 40 to supply the amplified reception signal to the RFIC 80.

The high-frequency front end circuit 10 is applied to a system that transmits and receives high-frequency signals using free communication channels in a communication band composed of multiple communication channels. For example, the high-frequency front end circuit 10 transmits and receives the high-frequency signals based on a TV white spaces standard. In the TV white spaces standard, channels on which television broadcasting signals are not transmitted, among the multiple communication channels each having a frequency band width of 6 [MHz] or 8 [MHz], which are set in an ultra high frequency (UHF) band of the television broadcasting, that is, in a communication band from 470 [MHz] to 790 [MHz], are used as the free communication channels. The frequency band width is not limited to 6 [MHz] or 8 [MHz] and may be appropriately set depending on the specifications of the television broadcasting as long as the frequency band width is lower than or equal to 20 [MHz].

The antenna matching circuit 20 performs impedance matching between the antenna ANT and a circuit toward the RFIC 80 side from the fixed frequency filter 30. The antenna matching circuit 20 is composed of an inductor and a capacitor. For example, in the antenna matching circuit 20, the element values of the inductor and the capacitor are set so that the return loss of the antenna ANT is lower than or equal to a desired value across the communication band.

The fixed frequency filter 30 is composed of an inductor and a capacitor. In other words, the fixed frequency filter 30 is a fixed frequency LC filter. Alternatively, the fixed frequency filter 30 may be composed of a resonator using a dielectric body. In other words, the fixed frequency filter 30 may be a fixed frequency dielectric resonator filter. In the fixed frequency filter 30, the element values of the inductor and the capacitor or the shape of the dielectric resonator is set so that the frequency band of the communication band is within a pass band and the frequency band outside the communication band is within an attenuation band. For example, the fixed frequency filter 30 is composed of a low pass filter. Accordingly, the fixed frequency filter 30 transmits the high-frequency signal within the communication band with low loss and attenuates the high-frequency signal outside the communication band.

The demultiplexing circuit 50 is composed of a circulator, a duplexer, or so on. The demultiplexing circuit 50 supplies the transmission signal (high-frequency signal) input from the transmission-side terminal to the antenna-side terminal and supplies the reception signal (high-frequency signal) input from the antenna-side terminal to the reception-side terminal.

The interference-wave suppression variable filter 40 at least includes a variable capacitor and further includes at least one of an inductor and a capacitor. In other words, the interference-wave suppression variable filter 40 is a variable frequency LC filter. The interference-wave suppression variable filter 40 is a filter, such as a band pass filter or a notch filter, having an attenuation pole.

The interference-wave suppression variable filter 40 varies the pass band and the attenuation band depending on the frequencies of a wireless communication channel and used communication channels causing IMD. The wireless communication channel is a channel used in the wireless communication, among the free communication channels. The used communication channels are communication channels used for the television broadcasting.

The interference-wave suppression variable filter 40 transmits the high-frequency signal with low loss in the frequency band of the wireless communication channel and attenuates the high-frequency signal by a desired attenuation in the frequency band of the used communication channels causing the IMD. The interference-wave suppression variable filter 40 attenuates the high-frequency signal in at least one used communication channel, among the multiple used communication channels causing the IMD.

Specifically, the interference-wave suppression variable filter 40 is composed of a band pass filter. In this case, the frequency band of the wireless communication channel is set within the pass band of the interference-wave suppression variable filter 40. The band pass filter composing the interference-wave suppression variable filter 40 has the attenuation pole at a low-frequency side of the pass band. This band pass filter may have the attenuation poles on both sides of the pass band. The frequency and the depth of attenuation of the attenuation pole at the low-frequency side or a high-frequency side of the band pass filter are determined so that the desired attenuation is achieved at the frequency of at least one used communication channel, among the multiple used communication channels causing IMD waves. The desired attenuation is attenuation at which the IMD waves are suppressed and the receiving sensitivity in the wireless communication channel is higher than or equal to a receiving sensitivity enabling the wireless communication.

Adopting the above configuration inhibits the IMD waves from occurring in a neighbor frequency domain including the wireless communication channel to improve the receiving sensitivity in the wireless communication channel. The neighbor frequency domain is defined by a frequency domain up to the communication channel apart from the frequency of the wireless communication channel by three communication channels in, for example, the communication band of the television broadcasting.

Figure 2:
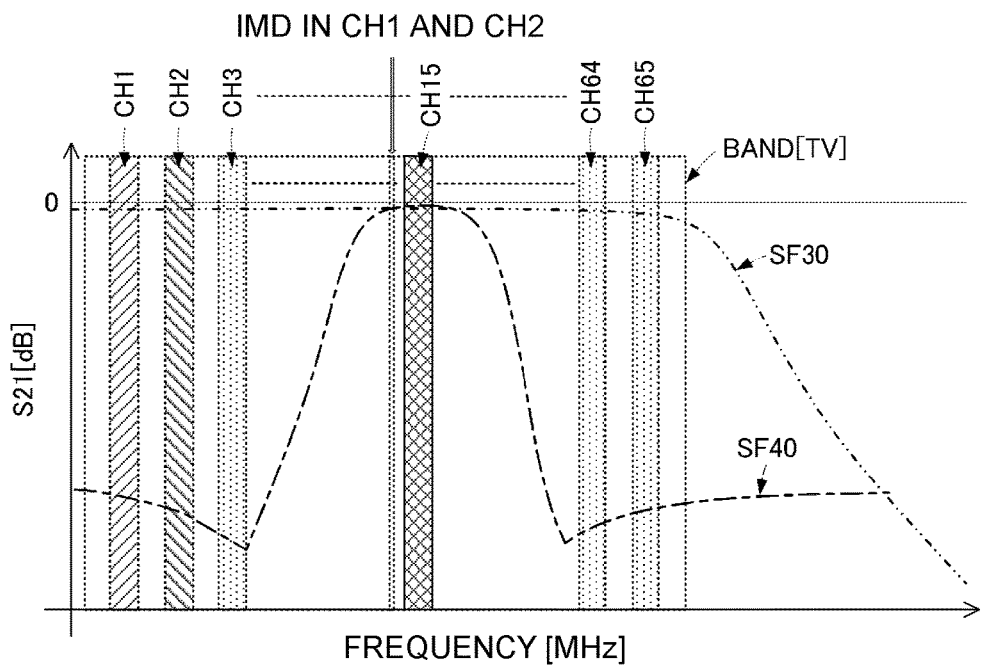
FIG. 2 is a diagram illustrating an effect of suppressing an IMD wave in the high-frequency front end circuit according to the first embodiment of the present disclosure.

FIG. 2 is a diagram illustrating an effect of suppressing the IMD waves in the high-frequency front end circuit according to the first embodiment of the present disclosure. FIG. 2 is a graph illustrating transmission characteristics (S21) from the antenna ANT side to the reception-side amplifier circuit 72. A case is illustrated in FIG. 2 in which a communication channel CH15 is the channel selected as the wireless communication channel.

As illustrated by a filter characteristic SF30 in FIG. 2, the fixed frequency filter 30 causes the frequency band of a communication band BAND[TV] to be within the pass band and causes the frequency band higher than the frequency band of the communication band BAND[TV] to be within the attenuation band.

As illustrated by a filter characteristic SF40 in FIG. 2, the interference-wave suppression variable filter 40 adjusts the communication channel CH15, which is the wireless communication channel, so as to be within the pass band. In addition, as illustrated by the filter characteristic SF40, the interference-wave suppression variable filter 40 adjusts communication channels CH1 and CH2, which are the used communication channels used for the television broadcasting, so as to be within the attenuation band to achieve the desired attenuation.

The communication channels CH1 and CH2 are the communication channels that are composed of frequencies close to the communication channel CH15 and that may cause the IMD waves. However, since the high-frequency signals (television broadcasting signals) in the communication channels CH1 and CH2 are attenuated by the interference-wave suppression variable filter 40, it is possible to suppress an occurrence of the IMD (inter modulation distortion) caused by the communication channels CH1 and CH2 in the high-frequency front end circuit 10.

Accordingly, as illustrated in FIG. 2, since an occurrence of the IMD is suppressed even if the frequency of the IMD is close to the wireless communication channel CH15 and is within the pass band of the fixed frequency filter 30 and the interference-wave suppression variable filter 40, it is possible to suppress degradation of the receiving sensitivity in the wireless communication channel CH15.

In particular, the channels used for the television broadcasting are varied depending on the reception status, such as the coverage, in the system described in the present embodiment. However, the high-frequency front end circuit 10 according to the present embodiment is capable of adjusting the frequency of the pass band and the frequency of the attenuation band of the interference-wave suppression variable filter 40. Accordingly, even if the reception status, that is, the channels used for the television broadcasting are varied to vary the frequencies of the communication channels causing the IMD, the high-frequency front end circuit 10 is capable of attenuating the high-frequency signal in the communication channel in accordance with the variation in the frequency of the communication channel to inhibit the IMD from occurring.

The RFIC 80 in the high-frequency front end circuit 10 having the above configuration has the following functions.

The RFIC 80 acquires information concerning the communication channels used by the system. This communication channel information includes the frequency band of the communication band of the television broadcasting, the used communication channels used for the television broadcasting, and the free channels. In addition, the communication channel information may include information specifying the channel used in the wireless communication (the wireless communication channel) among the free channels. The communication channel information may be acquired by a circuit in a reception system of the high-frequency front end circuit 10 or may be acquired by a communication system that is separately provided.

The RFIC 80 estimates the frequency of the IMD waves from the frequencies of the used communication channels. The frequency of the IMD waves is calculated using a known method, such as addition or subtraction of the frequencies of the multiple used communication channels or addition or subtraction of the frequencies of harmonics in the multiple used communication channels.

The RFIC 80 detects whether the estimated frequency of the IMD waves is within the neighbor frequency domain including the wireless communication channel. If the frequency of the IMD waves is within the neighbor frequency domain, the RFIC 80 identifies the used communication channel causing the IMD waves. The RFIC 80 sets the frequency and the depth of the attenuation of the attenuation pole of the interference-wave suppression variable filter 40 so that the desired attenuation is achieved in the identified used communication channel.

With the above configuration, it is possible to more reliably inhibit the IMD waves from occurring.

In addition, the RFIC 80 may detect the receiving sensitivity and may make a setting for the interference-wave suppression variable filter 40 in accordance with the result of the detection. Specifically, the RFIC 80 detects the receiving sensitivity in the wireless communication channel. The RFIC 80 stores a threshold value for the receiving sensitivity in advance. If the receiving sensitivity is lower than or equal to the threshold value, the RFIC 80 makes a setting for the interference-wave suppression variable filter 40. If the receiving sensitivity exceeds the threshold value, the RFIC 80 suspends making a setting for the interference-wave suppression variable filter 40 and keeps the current setting.

With the above configuration, the filter characteristics of the interference-wave suppression variable filter 40 may not be adjusted more than necessary. Accordingly, it is possible to suppress consumption of electric power for the adjustment of the filter characteristics of the interference-wave suppression variable filter 40 to realize the power saving of the high-frequency front end circuit 10.

Although the aspect is described in the above embodiment in which the interference-wave suppression variable filter 40 is composed of the band pass filter, the interference-wave suppression variable filter 40 may be composed of a trap filter. In this case, the attenuation pole of the trap filter is replaced with the attenuation pole at the low-frequency side or the high-frequency side of the band pass filter described above.

Figure 3:
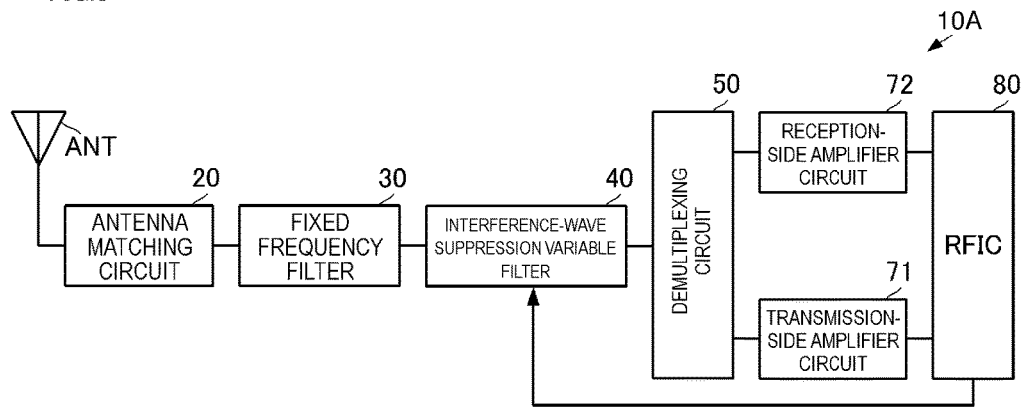
FIG. 3 is a functional block diagram of a high-frequency front end circuit according to a second embodiment of the present disclosure.

Next, a high-frequency front end circuit according to a second embodiment will now be described with reference to the drawing. FIG. 3 is a functional block diagram of the high-frequency front end circuit according to the second embodiment of the present disclosure.

A high-frequency front end circuit 10A according to the present embodiment differs from the high-frequency front end circuit 10 according to the first embodiment in the position of the interference-wave suppression variable filter 40.

In the high-frequency front end circuit 10A, the interference-wave suppression variable filter 40 is connected between the fixed frequency filter 30 and the demultiplexing circuit 50. Along with this difference, the reception-side terminal of the demultiplexing circuit 50 is connected to the reception-side amplifier circuit 72.

Also with the above configuration, the same effects and advantages as those of the high-frequency front end circuit 10 according to the first embodiment are achieved. When the demultiplexing circuit 50 is a duplexer using LC filters, at least a reception-side LC filter composing the demultiplexing circuit 50 may have the function of the interference-wave suppression variable filter 40.

Figure 4:
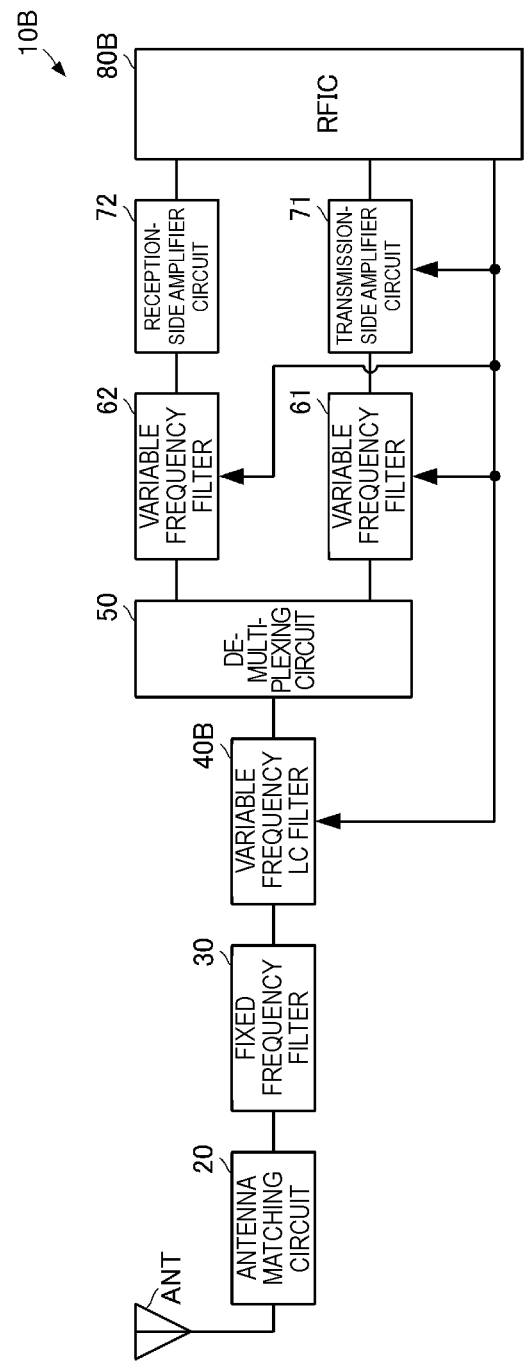
FIG. 4 is a functional block diagram of a high-frequency front end circuit according to a third embodiment of the present disclosure.

Next, a high-frequency front end circuit according to a third embodiment will now be described with reference to the drawings. FIG. 4 is a functional block diagram of the high-frequency front end circuit according to the third embodiment of the present disclosure.

A high-frequency front end circuit 10B according to the present embodiment differs from the high-frequency front end circuit 10A according to the second embodiment in that the interference-wave suppression variable filter 40 is replaced with a variable frequency LC filter 40B and variable frequency filters 61 and 62 are added.

The variable frequency LC filter 40B is a filter having the function of the interference-wave suppression variable filter 40, in which attenuation characteristics at the high-frequency side of the pass band and attenuation characteristics at the low-frequency side thereof are improved. Specifically, the variable frequency LC filter 40B is a filter capable of adjusting the frequency of the pass band while keeping the sharpness of the attenuation characteristics at the high-frequency side and the low-frequency side of the pass band. A specific circuit configuration of the variable frequency LC filter 40B will be described below.

Each of the variable frequency filters 61 and 62 at least includes a resonator and a variable capacitor and further includes at least one of an inductor and a capacitor depending on the filter characteristics. In other words, each of the variable frequency filters 61 and 62 is a variable frequency resonator filter. Each of the variable frequency filters 61 and 62 is a band pass filter using a resonance point and an anti-resonance point of the resonator. A specific circuit configuration of the variable frequency filters 61 and 62 will be described below.

The variable frequency filters 61 and 62 vary the pass band and the attenuation band depending on the wireless communication channel (selected channel). Here, the frequency band of the wireless communication channel is included in the pass band.

The variable frequency filters 61 and 62, each has the attenuation poles on both sides of the pass band on a frequency axis. Since each of the variable frequency filters 61 and 62 is the resonator filter, the attenuation characteristics on both sides of the pass band are sharper than those of the LC filter.

Accordingly, the variable frequency filters 61 and 62 transmit the high-frequency signal in the selected channel with low loss and attenuate the high-frequency signal in the adjacent communication channel. The variable frequency filters 61 and 62 may be designed so that not only the high-frequency signal in the adjacent communication channel is attenuated but also the high-frequency signals of the frequency bands of the adjacent channel, the channel adjacent to the adjacent channel, and the channel adjacent to the channel adjacent to the adjacent channel, that is, of three channels close to the communication channel (a total of six channels including the channels at the low-frequency side and the high-frequency side of the frequency domain) are attenuated. The width of the frequency bands to be attenuated may be appropriately set depending on the specifications of the system within the above range.

When communication using a frequency division duplex (FDD) system in which the transmission frequency is different from the reception frequency is performed in the wireless communication channel, the pass band of the variable frequency filter 61 is made different from the pass band of the variable frequency filter 62.

Figure 5:
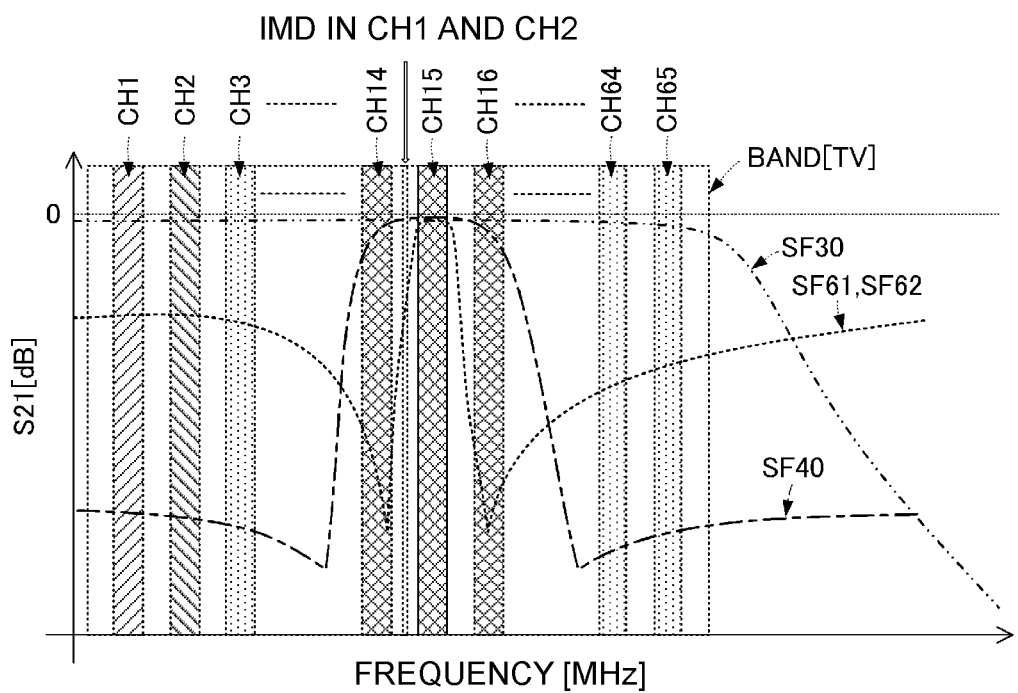
FIG. 5 is a graph illustrating transmission characteristics (S21) in the high-frequency front end circuit according to the third embodiment of the present disclosure.

With the above configuration, the high-frequency front end circuit 10B is capable of realizing transmission characteristics illustrated in FIG. 5. FIG. 5 is a graph illustrating the transmission characteristics (S21) in the high-frequency front end circuit according to the third embodiment of the present disclosure. A case is illustrated in FIG. 5 in which the communication channel CH15 is the channel selected as the wireless communication channel.

As illustrated by the filter characteristic SF30 in FIG. 5, the fixed frequency filter 30 causes the frequency band of the communication band BAND[TV] to be within the pass band and causes the frequency band higher than the frequency band of the communication band BAND[TV] to be within the attenuation band.

As illustrated by the filter characteristic SF40 in FIG. 5, the variable frequency LC filter 40B adjusts the communication channel CH15, which is the wireless communication channel, so as to be within the pass band. In addition, as illustrated by the filter characteristic SF40, the variable frequency LC filter 40B adjusts the communication channels CH1 and CH2, which are the used communication channels used for the television broadcasting, so as to be within the attenuation band to achieve the desired attenuation.

As illustrated by filter characteristics SF61 and SF62 in FIG. 5, the variable frequency filters 61 and 62 adjust the communication channel CH15, which is the wireless communication channel, so as to be within the pass band. In addition, the variable frequency filters 61 and 62 adjust communication channels CH14 and CH16 adjacent to the communication channel CH15 so as to be within the attenuation band to achieve the desired attenuation.

With the above configuration, an occurrence of the IMD waves of the frequency adjacent to the wireless communication channel is capable of being suppressed and the signals in the communication channels adjacent to the wireless communication channel are capable of being attenuated. Accordingly, it is possible to transmit and receive the high-frequency signal in the wireless communication channel with low loss and, particularly in the reception, to suppress the degradation of the receiving sensitivity.

In particular, as illustrated in FIG. 5, although the variable frequency filter 62 may not be capable of attenuating the IMD waves by the desired attenuation when the frequency of the IMD waves is between the wireless communication channel and the adjacent channel, the use of the configuration of the high-frequency front end circuit 10B enables an occurrence of such IMD waves to be suppressed to improve the receiving sensitivity in the wireless communication channel.

When the frequency of the IMD waves is within the attenuation band of the variable frequency filter 62, the filter characteristics of the variable frequency LC filter 40B may not be adjusted or may be adjusted so as to further increase the attenuation.

Figure 6:
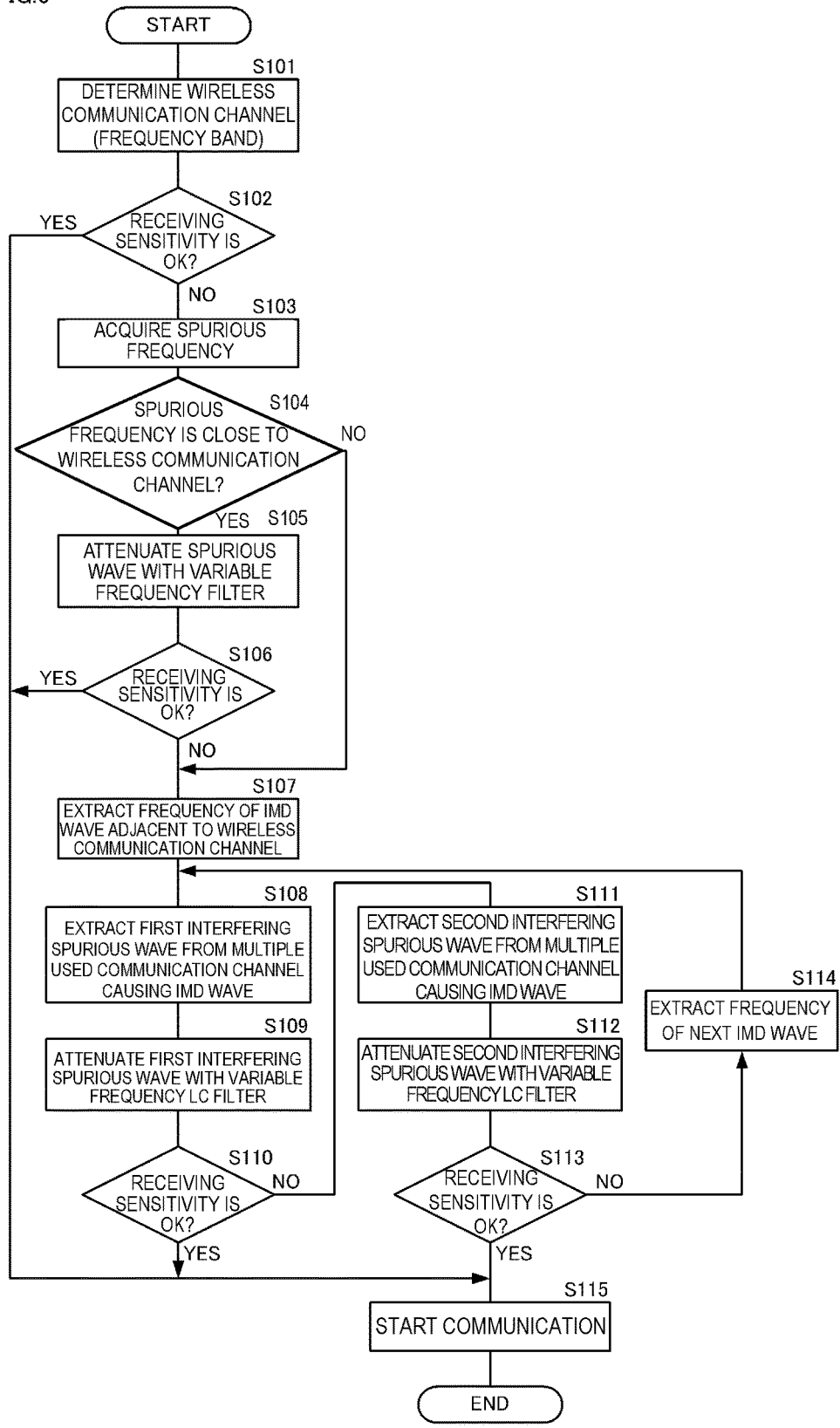
FIG. 6 is a flowchart illustrating a method of suppressing IMD according to the third embodiment of the present disclosure.

More specifically, the high-frequency front end circuit 10B according to the third embodiment described above is also capable of suppressing the IMD waves according to a flow illustrated in FIG. 6. FIG. 6 is a flowchart illustrating a method of suppressing the IMD according to the third embodiment of the present disclosure.

First, the high-frequency front end circuit 10B determines the wireless communication channel (S101). The wireless communication channel is capable of being determined using the information concerning the communication channels used by the system, as described above.

The high-frequency front end circuit 10B detects the receiving sensitivity and determines whether the receiving sensitivity is higher than a threshold value at which the wireless communication is enabled. If the receiving sensitivity is higher than the threshold value (YES in S102), the high-frequency front end circuit 10B starts the wireless communication (S115).

If the receiving sensitivity is lower than or equal to the threshold value (NO in S102), the high-frequency front end circuit 10B acquires the frequency of spurious waves (S103). The spurious waves are, for example, the television broadcasting signals in channels different from the wireless communication channel and are capable of being acquired using the information concerning the communication channels used by the system or the like.

If the spurious waves are close to the wireless communication channel (YES in S104), the high-frequency front end circuit 10B adjusts the filter characteristics of the variable frequency filter 62 to attenuate the spurious waves (S105). If the spurious waves are not close to the wireless communication channel (NO in S104), the high-frequency front end circuit 10B extracts the frequency of the IMD waves close to the wireless communication channel (S107).

The high-frequency front end circuit 10B detects the receiving sensitivity in a state in which the attenuation of the spurious waves is performed. If the receiving sensitivity is higher than the threshold value (YES in S106), the high-frequency front end circuit 10B starts the wireless communication (S115). If the receiving sensitivity is lower than or equal to the threshold value (NO in S106), the high-frequency front end circuit 10B extracts the frequency of the IMD waves close to the wireless communication channel (S107). The extraction of the frequency of the IMD waves close to the wireless communication channel is capable of being performed based on the information concerning the communication channels used by the system, as described above.

The high-frequency front end circuit 10B extracts first interfering spurious waves from the multiple used communication channels causing the IMD waves the frequency of which is extracted (S108). The first interfering spurious waves are in the used communication channel having a high impact on the IMD waves, among the multiple used communication channels.

The high-frequency front end circuit 10B adjusts the filter characteristics of the variable frequency LC filter 40B having the function of the interference-wave suppression variable filter 40 to attenuate the first interfering spurious waves (S109).

The high-frequency front end circuit 10B detects the receiving sensitivity in a state in which the attenuation of the first interfering spurious waves is performed. If the receiving sensitivity is higher than the threshold value (YES in S110), the high-frequency front end circuit 10B starts the wireless communication (S115). If the receiving sensitivity is lower than or equal to the threshold value (NO in S110), the high-frequency front end circuit 10B extracts second interfering spurious waves (S111). The second interfering spurious waves are in the used communication channel causing the IMD waves, which are paired with the first interfering spurious waves, and are in the used communication channel having a low impact on the IMD waves. The threshold value is, for example, −90 [dBm] in the case of a system adopting the TV white spaces. The threshold value may be appropriately set according to the specifications of the system.

The high-frequency front end circuit 10B adjusts the filter characteristics of the variable frequency LC filter 40B to attenuate the second interfering spurious waves (S112).

The high-frequency front end circuit 10B detects the receiving sensitivity in a state in which the attenuation of the second interfering spurious waves is performed. If the receiving sensitivity is higher than the threshold value (YES in S113), the high-frequency front end circuit 10B starts the wireless communication (S115). If the receiving sensitivity is lower than or equal to the threshold value (NO in S113), the high-frequency front end circuit 10B extracts the frequency of the next IMD waves (S114). Then, the filtering process subsequent to Step S108 is repeated.

Performing the above process enables the high receiving sensitivity in the wireless communication channel to be reliably ensured.

In the high-frequency front end circuits 10 and 10A according to the first and second embodiments, respectively, the processing from Step S103 to Step S106 illustrated in FIG. 6 is omitted.

Figure 7:
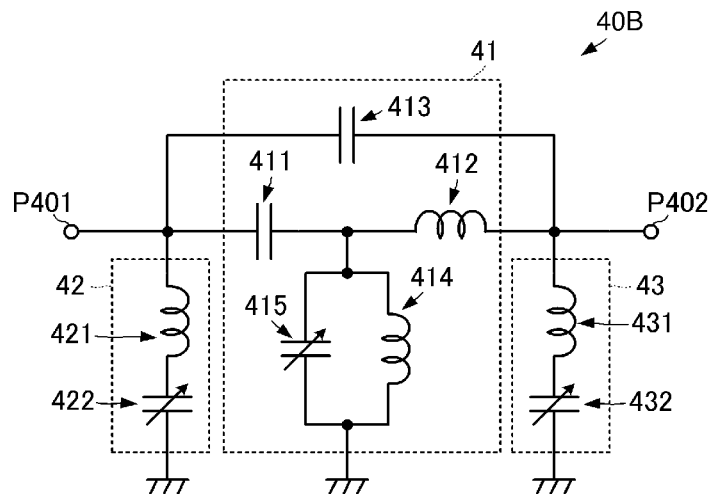
FIG. 7 is a circuit diagram illustrating one aspect of a variable frequency LC filter according to the third embodiment of the present disclosure.

Next, a specific configuration of the variable frequency filter of the LC filter type in the high-frequency front end circuit according to each embodiment will now be described. FIG. 7 is a circuit diagram illustrating one aspect of the variable frequency LC filter according to the third embodiment of the present disclosure.

The variable frequency LC filter 40B includes a series arm LC filter circuit 41, a first parallel arm LC filter circuit 42, a second parallel arm LC filter circuit 43, and connection terminals P401 and P402. The connection terminal P401 and the connection terminal P402 correspond to an "input terminal" and an "output terminal" of the present disclosure.

The series arm LC filter circuit 41 is connected between the connection terminal P401 and the connection terminal P402. The first parallel arm LC filter circuit 42 is connected between the connection terminal P401 side of the series arm LC filter circuit 41 and ground potential. The second parallel arm LC filter circuit 43 is connected between the connection terminal P402 side of the series arm LC filter circuit 41 and the ground potential.

The series arm LC filter circuit 41 includes capacitors 411 and 413, inductors 412 and 414, and a variable capacitor 415. The capacitor 411 and the inductor 412 are connected in series between the connection terminals P401 and P402. Here, the inductor 412 is directly connected to the connection terminal P402. The capacitor 413 is connected in parallel to the series resonant circuit composed of the capacitor 411 and the inductor 412. The inductor 414 and the variable capacitor 415 are connected in parallel to each other. This parallel resonant circuit is connected between a node between the capacitor 411 and the inductor 412 and the ground potential.

The first parallel arm LC filter circuit 42 includes an inductor 421 and a variable capacitor 422. A series resonant circuit composed of the inductor 421 and the variable capacitor 422 is connected between the connection terminal P401 side of the series arm LC filter circuit 41 and the ground potential.

The second parallel arm LC filter circuit 43 includes an inductor 431 and a variable capacitor 432. A series resonant circuit composed of the inductor 431 and the variable capacitor 432 is connected between the connection terminal P402 side of the series arm LC filter circuit 41 and the ground potential.

Figure 8:
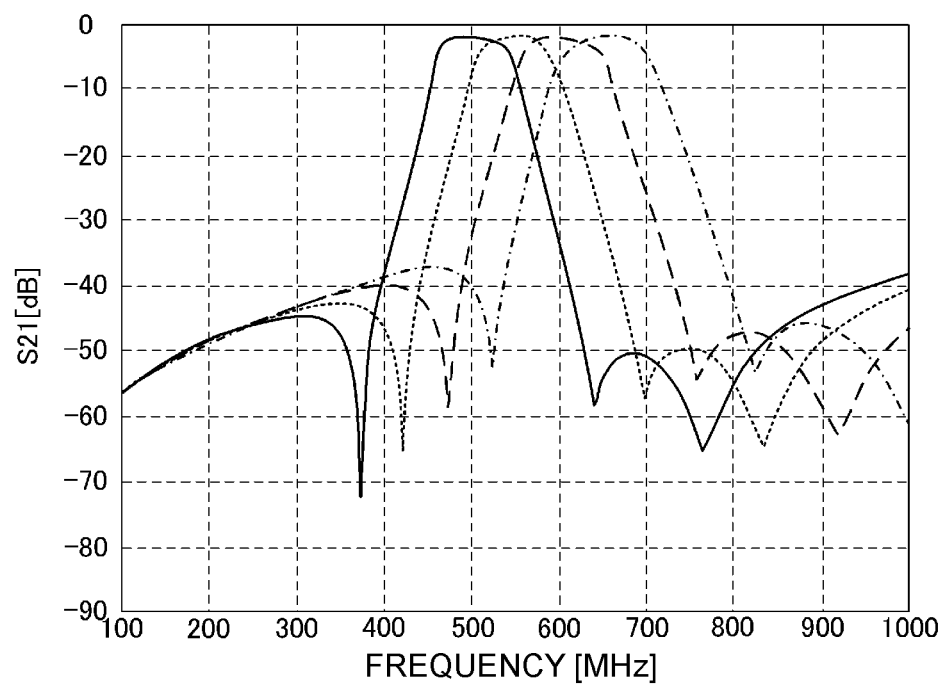
FIG. 8 is a graph illustrating the transmission characteristics of the variable frequency filter illustrated in FIG. 7.

In the above configuration, varying the capacitances of the variable capacitors 415, 422, and 432 enables a band pass filter the pass band of which is varied to be realized. FIG. 8 is a graph illustrating the transmission characteristics of the variable frequency filter illustrated in FIG. 7. The use of the variable frequency LC filter 40B enables the filter characteristics the pass band width of which is about 100 [MHz] and which have the attenuation poles on both sides of the pass band to be realized, as illustrated in FIG. 8. In particular, as illustrated in FIG. 7, the connection of the inductor 412 in the series arm LC filter circuit 41 to the connection terminal P402 with no capacitor interposed therebetween enables the attenuation characteristics to be sharpened.

In other words, the direct connection of the inductor 412 in the series arm LC filter circuit 41 to the connection terminal P402 or connection of the inductor 412 in the series arm LC filter circuit 41 to the connection terminal P402 with another inductor interposed therebetween enables the attenuation characteristics to be sharpened.

It is considered that this is because of the following reasons.

Since the frequency characteristics of the capacitor directly connected to the inductor are characteristics in which the low frequencies are attenuated and the high frequencies are transmitted, that is, characteristics of a high pass filter or the like, degradation of the attenuation at the high frequencies may be caused.

Since the frequency characteristics of the inductor directly connected to the connection terminal are characteristics in which the high frequencies are attenuated and the low frequencies are transmitted, that is, characteristics of a low pass filter or the like, improvement of the attenuation at the high frequencies may be caused.

When the inductor is connected to the connection terminal with another inductor interposed therebetween, further improvement of the attenuation at the high frequencies may be caused.

In the variable frequency LC filter 40B, an LC resonant circuit, or an inductor and a capacitor connected in series or parallel may be further connected at the connection terminal P401 side and an LC resonant circuit, or an inductor and a capacitor may be connected between the connection terminal P402 and the ground potential.

Figure 9:
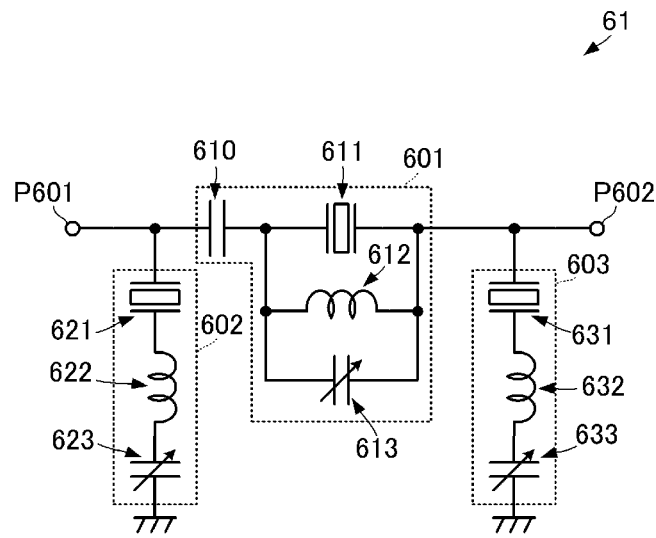
FIG. 9 is a circuit diagram illustrating one aspect of the variable frequency filter of a resonator filter type according to an embodiment of the present disclosure.

Next, a specific configuration of the variable frequency filter of an elastic wave resonator filter type in the high-frequency front end circuit according to each embodiment will now be described. FIG. 9 is a circuit diagram illustrating one aspect of the variable frequency filter of the resonator filter type according to an embodiment of the present disclosure. The resonator described below is a piezoelectric resonator, such as a surface acoustic wave (SAW) resonator.

The variable frequency filter 61 includes a series arm resonant circuit 601, a first parallel arm resonant circuit 602, a second parallel arm resonant circuit 603, and connection terminals P601 and P602.

The series arm resonant circuit 601 is connected between the connection terminal P601 and the connection terminal P602. The first parallel arm resonant circuit 602 is connected between the connection terminal P601 side of the series arm resonant circuit 601 and the ground potential. The second parallel arm resonant circuit 603 is connected between the connection terminal P602 side of the series arm resonant circuit 601 and the ground potential.

The series arm resonant circuit 601 includes a capacitor 610, a resonator 611, an inductor 612, and a variable capacitor 613. The resonator 611, the inductor 612, and the variable capacitor 613 are connected in parallel to each other. The capacitor 610 is connected in series to this parallel circuit. This resonant circuit is connected between the connection terminal P601 and the connection terminal P602. Here, the capacitor 610 is connected to the connection terminal P601, that is, is connected to the first parallel arm resonant circuit 602.

The first parallel arm resonant circuit 602 includes a resonator 621, an inductor 622, and a variable capacitor 623. The resonator 621, the inductor 622, and the variable capacitor 623 are connected in series to each other. This series resonant circuit is connected between the connection terminal P601 and the ground potential.

The second parallel arm resonant circuit 603 includes a resonator 631, an inductor 632, and a variable capacitor 633. The resonator 631, the inductor 632, and the variable capacitor 633 are connected in series to each other. This series resonant circuit is connected between the connection terminal P602 and the ground potential.

The series arm resonant circuit 601 and the first and second parallel arm resonant circuits 602 and 603 are band pass filters using the resonance points and the anti-resonance points of the resonators 611, 621, and 631, respectively. Varying the capacitances of the variable capacitors 613, 623, and 633 causes the variable frequency filter 61 to function as a band pass filter the pass band of which is varied.

The impedance of the resonator 621 is lower than the impedance of the resonator 631.

Figure 10:
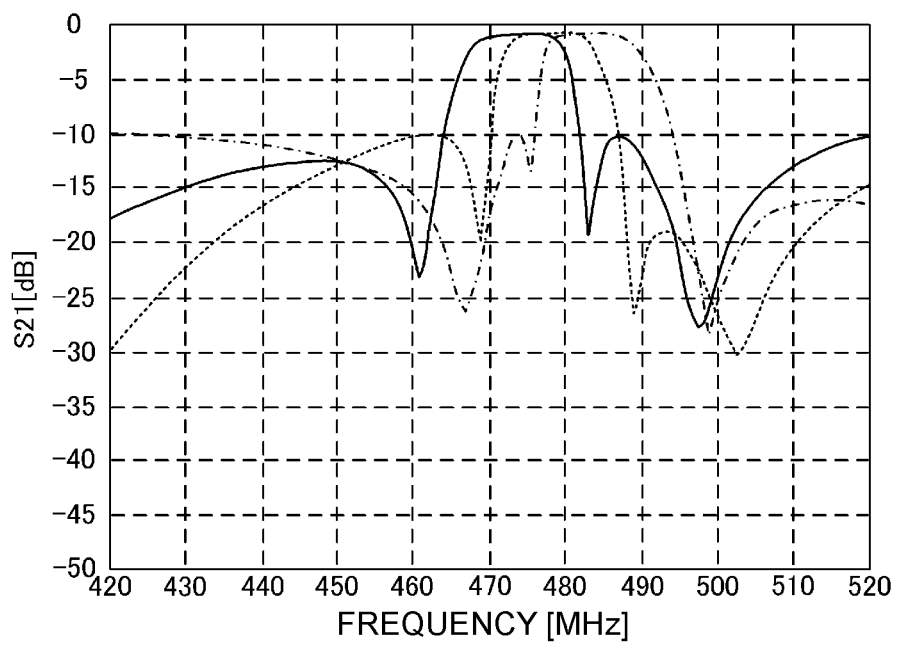
FIG. 10 is a graph illustrating the transmission characteristics of the variable frequency filter illustrated in FIG. 9.

FIG. 10 is a graph illustrating the transmission characteristics of the variable frequency filter illustrated in FIG. 9. The use of the variable frequency filter 61 enables the filter characteristics the pass band width of which is about 10 [MHz] and which have the attenuation poles on both sides of the pass band to be realized, as illustrated in FIG. 10. In particular, as illustrated in FIG. 9, the connection of the capacitor at the first parallel arm resonant circuit 602 side of the series arm resonant circuit, that is, the connection of the capacitor at the resonant circuit side including the resonator having lower impedance enables the attenuation poles having the sharp attenuation characteristics and the great attenuation to be formed on both sides of the pass band on the frequency axis. Accordingly, the high-frequency signal in the frequency band in the channel adjacent to the selected channel is capable of being greatly attenuated.

Although the IMD waves are exemplified in the above embodiments, the same effects and advantages are capable of being achieved by applying the configurations according to the above embodiments to other spurious waves the frequency of which is varied depending on the reception status.

REFERENCE SIGNS LIST 10, 10A, 10B high-frequency front end circuit
20 antenna matching circuit
30 fixed frequency filter
40 interference-wave suppression variable filter
40B variable frequency LC filter
41 series arm LC filter circuit
42 first parallel arm LC filter circuit
43 second parallel arm LC filter circuit
50 demultiplexing circuit
61, 62 variable frequency filter
71 transmission-side amplifier circuit 72 reception-side amplifier circuit
80 RFIC
411, 413 capacitor
412, 414 inductor
415, 422, 432 variable capacitor
421, 431 inductor
601 series arm resonant circuit
602 first parallel arm resonant circuit
603 second parallel arm resonant circuit
610 capacitor
611, 621, 631 resonator
612 inductor
613, 623, 633 variable capacitor
622 inductor
632 inductor
ANT antenna

The invention claimed is:

1. A high-frequency front end circuit that, among a plurality of communication channels within a frequency band of a system, determines a wireless communication channel that is not used by the system on which to perform wireless communication, the high-frequency front end circuit comprising:
 a filter configured to attenuate a high-frequency signal outside the frequency band; and
 a variable filter having a variable pass band and/or a variable attenuation band, wherein:
  frequencies of at least one of the plurality of communication channels are within the attenuation band, the at least one communication channel being used by the system and being a channel that causes an interference wave occurring in a neighbor frequency domain that includes the wireless communication channel not used by the system, and
  frequencies of the interference wave caused by the at least one communication channel and occurring in the neighbor frequency domain that includes the wireless communication channel not used by the system are within the pass band.

2. The high-frequency front end circuit according to claim 1,
 wherein the system is a wireless communication system using TV white spaces,
 wherein the frequency band is used for television broadcasting, and
 wherein the plurality of communication channels are for television broadcasting.

3. The high-frequency front end circuit according to claim 1, wherein the at least one communication channel used by the system and causing the interference wave is used for television broadcasting.

4. The high-frequency front end circuit according to claim 1,
 wherein a bandwidth of each of the plurality of communication channels is 20 MHz or less, and
 wherein the neighbor frequency domain includes the wireless communication channel not used by the system and communication channels within three communication channels of the wireless communication channel not used by the system.

5. The high-frequency front end circuit according to claim 1, further comprising:
 an elastic wave variable filter configured to attenuate a spurious wave occurring in the neighbor frequency domain, the elastic wave variable filter comprising an elastic wave element and a variable capacitor,
 wherein the variable filter is an LC variable filter and comprises an inductor and a capacitor, and
 wherein the variable filter is configured to attenuate the high-frequency signal in the at least one communication channel used by the system and causing the interference wave, and not attenuated by the elastic wave variable filter.

6. The high-frequency front end circuit according to claim 1, further comprising:
 a radio frequency integrated circuit (RFIC),
 wherein the RFIC is configured to:
  acquire information concerning the plurality of communication channels,
  detect whether the interference wave occurs in the neighbor frequency domain,
  identify the at least one communication channel used by the system and causing the interference wave if the interference wave occurs in the neighbor frequency domain, and
  specify a frequency to be attenuated in association with the identified at least one communication channel for the variable filter, and
 wherein the variable filter is configured to attenuate the frequency specified by the RFIC.

7. The high-frequency front end circuit according to claim 6,
 wherein the RFIC is further configured to:
  detect a receiving sensitivity in the wireless communication channel, and
  specify a frequency to be attenuated for the variable filter if the receiving sensitivity is less than or equal to a threshold value at which the wireless communication is started.

8. The high-frequency front end circuit according to claim 1,
 wherein the variable filter comprises:
 an input terminal,
 an output terminal,
 a series arm LC filter circuit connected between the input terminal and the output terminal,
 a first parallel arm LC filter circuit having a first end connected to a first end of the series arm LC filter circuit and a second end connected to ground, and a second parallel arm LC filter circuit having a first end connected to a second end of the series arm LC filter circuit and a second end connected to ground,
 wherein the first parallel arm LC filter circuit and the second parallel arm LC filter circuit each comprise a variable capacitor and an inductor connected in series with each other,
 wherein the series arm LC filter circuit comprises a fixed capacitor, an LC series circuit, and an LC parallel circuit,
 wherein the fixed capacitor is connected in parallel to the LC series circuit,
 wherein the LC series circuit comprises a fixed capacitor and an inductor connected in series with each other, a first end of the LC series circuit being connected to the input terminal and a second end of the LC series circuit being connected to the output terminal,
 wherein the LC parallel circuit comprises a variable capacitor and an inductor connected in parallel with each other, and
 wherein the inductor of the LC series circuit is directly connected to the output terminal.

9. The high-frequency front end circuit according to claim 1, wherein the wireless communication channel is used for wireless communication using a frequency division duplex (FDD) system in which a frequency of a transmission signal is different from a frequency of a reception signal.

10. A spurious-wave suppressing method comprising:
acquiring a plurality of communication channels within a frequency band of a system;
determining a wireless communication channel from free communication channels, among the plurality of communication channels, that are not used by the system;
determining whether an interference wave corresponding to a communication channel used by the system occurs in a neighbor frequency domain that includes the wireless communication channel; and
adjusting attenuation characteristics of a variable filter so that frequencies of a high-frequency signal in at least one communication channel used by the system, among the communication channels causing the interference wave, are within an attenuation band of the variable filter, and so that frequencies of the interference wave are within a pass band of the variable filter, if it is determined that the interference wave occurs in the neighbor frequency domain.

* * * * *